(12) United States Patent
Soric et al.

(10) Patent No.: US 11,848,662 B2
(45) Date of Patent: Dec. 19, 2023

(54) TUNABLE MONOLITHIC GROUP III-NITRIDE FILTER BANKS

(71) Applicant: Raytheon Company, Tewksbury, MA (US)

(72) Inventors: Jason C. Soric, North Andover, MA (US); Jeffrey R. Laroche, Andover, MA (US); Eduardo M. Chumbes, Andover, MA (US); Adam E. Peczalski, Everett, MA (US)

(73) Assignee: Raytheon Company, Tewksbury, MA (US)

( * ) Notice: Subject to any disclaimer, the term of this patent is extended or adjusted under 35 U.S.C. 154(b) by 643 days.

(21) Appl. No.: 17/018,897

(22) Filed: Sep. 11, 2020

(65) Prior Publication Data

US 2022/0085795 A1   Mar. 17, 2022

(51) Int. Cl.
*H03H 9/54* (2006.01)
*H01L 21/02* (2006.01)
(Continued)

(52) U.S. Cl.
CPC ......... *H03H 9/545* (2013.01); *H01L 21/0254* (2013.01); *H01L 21/02378* (2013.01);
(Continued)

(58) Field of Classification Search
CPC ...... H03H 9/564; H03H 9/174; H03H 9/0542; H03H 9/562; H03H 3/02; H03H 9/568;
(Continued)

(56) References Cited

U.S. PATENT DOCUMENTS

| 7,514,759 B1 | 4/2009 | Mehta et al. |
| 8,502,235 B2 | 8/2013 | Sheppard et al. |

(Continued)

FOREIGN PATENT DOCUMENTS

| CN | 116114173 | 5/2023 |
| JP | 2005136588 A | 5/2005 |

(Continued)

OTHER PUBLICATIONS

Fichtner, Simon, et al., "AlScN: A III-V semiconductor based ferroelectric", J. Appl. Phys. 125, 114103, (Mar. 18, 2019), 7 pgs.

(Continued)

*Primary Examiner* — Quan Tra
*Assistant Examiner* — Anh-Quan Tra
(74) *Attorney, Agent, or Firm* — Schwegman Lundberg & Woessner, P.A.

(57) ABSTRACT

Embodiments of a single-chip ScAlN tunable filter bank include a plurality of switching elements, and a plurality of channel filters integrated on a monolithic platform. The monolithic platform may comprise a single crystal base and each of the switching elements may comprise at least one of a scandium aluminum nitride (ScAlN) or other Group III-Nitride transistor structure fabricated on the single crystal base. In these embodiments, each channel filter comprises a multi-layered ScAlN structure comprising one or more a single-crystal epitaxial ScAlN layers fabricated on the single crystal base. The ScAlN layers for each channel filter may be based on desired frequency characteristics of an associated one of the RF channels.

20 Claims, 11 Drawing Sheets

(51) Int. Cl.

| | |
|---|---|
| *H01L 29/20* | (2006.01) |
| *H01L 29/205* | (2006.01) |
| *H01L 29/66* | (2006.01) |
| *H01L 29/778* | (2006.01) |
| *H03F 3/195* | (2006.01) |
| *H03H 3/02* | (2006.01) |
| *H03H 9/56* | (2006.01) |
| *H04B 1/10* | (2006.01) |
| *H10N 39/00* | (2023.01) |
| *H04B 1/06* | (2006.01) |

(52) U.S. Cl.
CPC ........ *H01L 29/2003* (2013.01); *H01L 29/205* (2013.01); *H01L 29/66462* (2013.01); *H01L 29/7786* (2013.01); *H03F 3/195* (2013.01); *H03H 3/02* (2013.01); *H03H 9/562* (2013.01); *H03H 9/568* (2013.01); *H04B 1/10* (2013.01); *H10N 39/00* (2023.02); *H03F 2200/294* (2013.01); *H03F 2200/451* (2013.01); *H04B 1/06* (2013.01)

(58) Field of Classification Search
CPC ............. H03H 9/545; H03H 2003/023; H03H 2003/0442; H04B 1/10; H04B 1/06; H01L 29/205; H01L 21/0254; H01L 21/02378; H01L 29/7786; H01L 29/2003; H01L 29/66462; H01L 29/4175; H01L 29/201; H03F 3/195; H03F 2200/451; H03F 2200/294; H10N 39/00
USPC .......................................................... 333/184
See application file for complete search history.

(56) References Cited

U.S. PATENT DOCUMENTS

| | | | |
|---|---|---|---|
| 8,983,414 B2 | 3/2015 | Ozgur et al. | |
| 9,917,567 B2 | 3/2018 | Bradley et al. | |
| 10,283,597 B2 | 5/2019 | Hardy et al. | |
| 2012/0061681 A1* | 3/2012 | Thei .................... | H01L 27/0617 257/77 |
| 2014/0312994 A1 | 10/2014 | Meltaus et al. | |
| 2018/0062617 A1 | 3/2018 | Yun et al. | |
| 2018/0175826 A1 | 6/2018 | Sadhu et al. | |
| 2018/0278231 A1 | 9/2018 | Hurwitz | |
| 2019/0081611 A1 | 3/2019 | Vetury et al. | |
| 2019/0333965 A1 | 10/2019 | Campanella-pineda et al. | |
| 2020/0220513 A1 | 7/2020 | Vetury et al. | |
| 2020/0227470 A1 | 7/2020 | Then et al. | |
| 2020/0274607 A1 | 8/2020 | Shealy et al. | |
| 2021/0067123 A1 | 3/2021 | Shealy et al. | |
| 2021/0091746 A1* | 3/2021 | Gokhale ............ | H03H 9/02015 |
| 2021/0359664 A1* | 11/2021 | Tabrizian ............... | H03H 9/568 |

FOREIGN PATENT DOCUMENTS

| | | | |
|---|---|---|---|
| TW | 202213945 A | 4/2022 | |
| WO | WO-2017111892 A1 | 6/2017 | |
| WO | WO-2022056138 A2 | 3/2022 | |
| WO | WO-2022056138 A3 | 4/2022 | |

OTHER PUBLICATIONS

"Taiwanese Application Serial No. 110129667, Office Action dated Jul. 22, 2022", with machine translation, 8 pgs.

"Taiwanese Application Serial No. 110129667, Response filed Sep. 22, 2022 to Office Action dated Jul. 22, 2022", with English claims, 40 pgs.

"International Application Serial No. PCT/US2021/049679, International Search Report dated Feb. 28, 2022", 9 pgs.

"International Application Serial No. PCT/US2021/049679, Invitation to Pay Additional Fees dated Jan. 5, 2022", 19 pgs.

"International Application Serial No. PCT/US2021/049679, Written Opinion dated Feb. 28, 2022", 17 pgs.

"Taiwanese Application Serial No. 110129667, First Office Action dated Jan. 25, 2022", with machine translation, 17 pgs.

"Taiwanese Application Serial No. 110129667, Response filed Mar. 21, 2022 to First Office Action dated Jan. 25, 2022", with English translation of claims, 50 pgs.

Lakin, K M, et al., "Filter banks implemented with integrated thin film resonators", 2000 IEEE Ultrasonics Symposium Proceedings. San Juan, PR, ; [IEEE Ultrasonics Symposium Proceedings], New York, NY : IEEE, US, vol. 1, (Oct. 22-25, 2000), 851-854.

Park, Mingyo, et al., "Super High-Frequency Scandium Aluminum Nitride Crystalline Film Bulk Acoustic Resonators", IEEE International Ultrasonics Symposium (IUS), IEEE, (Oct. 6, 2019), 1689-1692.

"International Application Serial No. PCT US2021 049679, International Preliminary Report on Patentability dated Mar. 23, 2023", 19 pgs.

"Taiwanese Application Serial No. 110129667, Office Action dated Mar. 20, 2023", With English machine translation, 6 pgs.

"Taiwanese Application Serial No. 110129667, Response filed Jun. 16, 2023 to Office Action dated Mar. 20, 2023", W English Claims, 26 pgs.

\* cited by examiner

TUNABLE MONOLITHIC GROUP III-NITRIDE FILTER BANKS

TECHNICAL FIELD

Embodiments pertain to monolithic integration of scandium aluminum nitride (ScAIN) with other Group III-Nitride circuit elements and filters. Some embodiments pertain to tunable filter banks.

BACKGROUND

Conventional filter banks suffer from size, functionality, and tunability issues. Typical approaches require the integration of discrete BAW devices and switches or are large and mechanically tuned. Thus, there are general needs for tunable filters and filter banks that overcome the size, functionality, and tunability of conventional filters and filter banks.

SUMMARY

A single-chip scandium aluminum nitride (ScAIN) tunable filter bank include a plurality of switching elements and a plurality of channel filters integrated on a monolithic platform. The monolithic platform may comprise a single crystal base and each of the switching elements may comprise a scandium aluminum nitride (ScAIN) or other Group III-Nitride transistor structure fabricated on the single crystal base. In these embodiments, each channel filter comprises a multi-layered ScAIN structure comprising one or more a single-crystal epitaxial ScAIN layers fabricated on the single crystal base. The ScAIN layers for each channel filter may be based on desired frequency characteristics of an associated one of the RF channels.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Some embodiments disclosed herein may overcome the size, functionality, and tunability issues of conventional filter banks by integrating multiple bulk acoustic wave (BAW) filters at different or the same frequencies with switches, amplifiers, mixers, or other ScAIN and Group III-Nitride devices on the same chip. Further, frequency tuning of each BAW filter may be accomplished by the intrinsic giant ferroelectric effect of ScAIN or other device technologies such as varactors, all of which are integrated on the same chip. The ScAIN allows for unprecedented frequency bandwidths. In addition, the growth of this material reduces the loss and allows for integration of other electronic devices onto a single chip. These embodiments are discussed in more detail below. Some embodiments provide tunable and ultra-small filter banks at a chip scale level.

Figure 1:
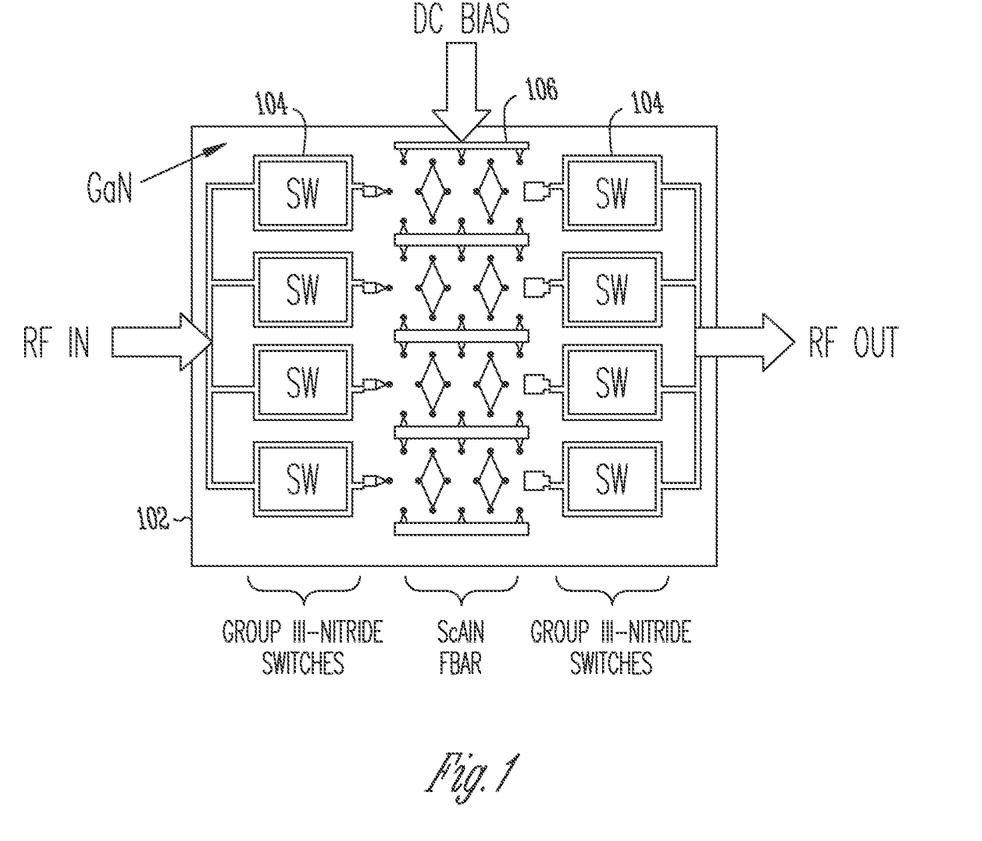
FIG. 1 is a monolithic filter bank with multiple channel filters in accordance with some embodiments.
Figure 2:
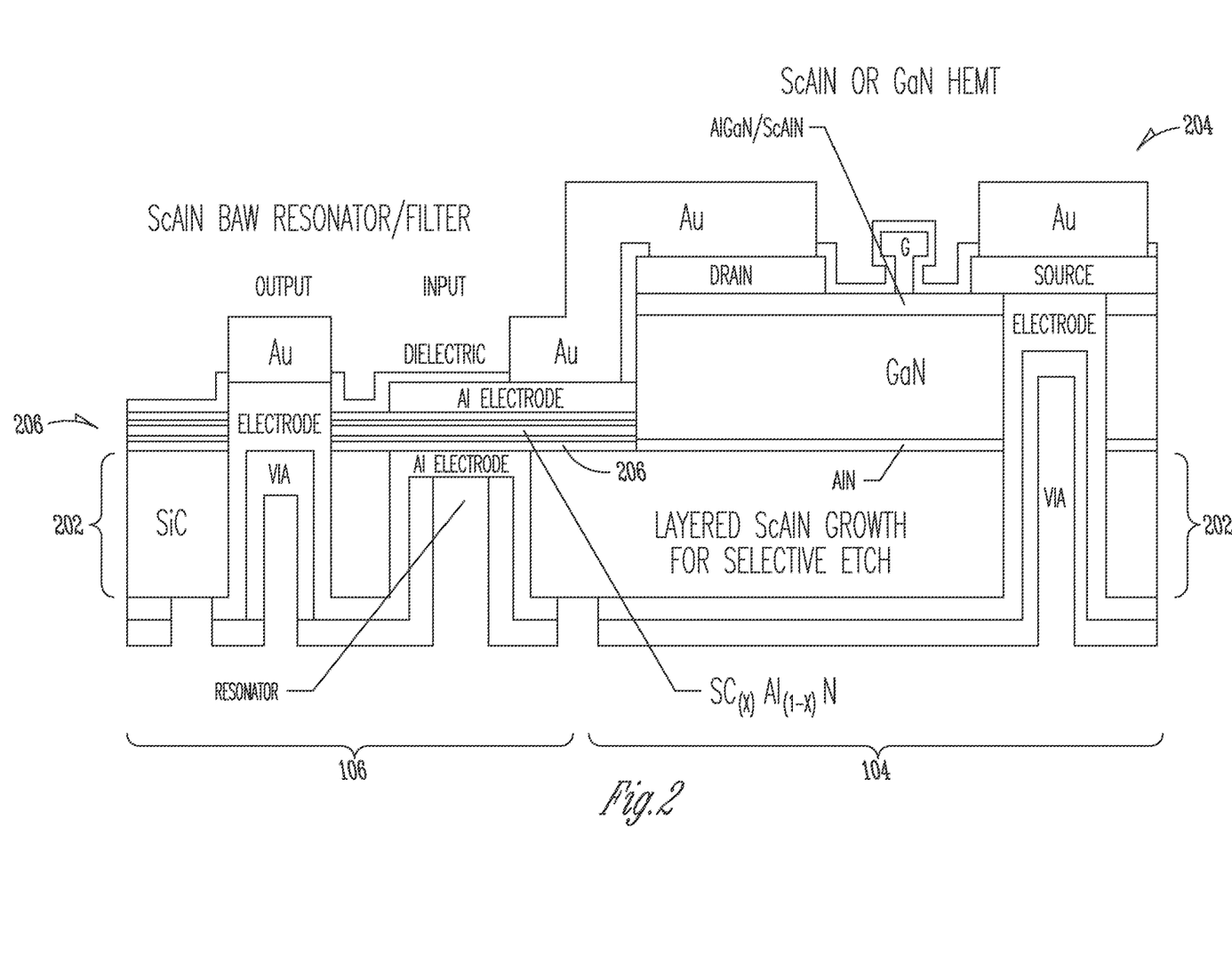
FIG. 2 is a cross sectional view of a portion of a monolithic device in accordance with some embodiments.

FIG. 1 is a monolithic filter bank with multiple channel filters in accordance with some embodiments. Single-chip ScAIN tunable filter bank 102 may be configured for selectively filtering multiple RF channels. The single-chip ScAIN tunable filter bank 102 may include a plurality of switching elements 104 and a plurality of channel filters 106. The switching elements 104 and channel filters 106 may be integrated on a monolithic platform 202 (FIG. 2). Each channel filter 106 may be associated with one of the multiple RF channels and configured to provide in an RF signal path between a pair of the switching elements 104.

FIG. 2 is a cross sectional view of a portion of a monolithic device in accordance with some embodiments. The monolithic platform 202 may comprise a single crystal base and each of the switching elements 104 may comprise a ScAIN or other Group III-Nitride transistor structure 204 fabricated on the single crystal base 202. In these embodiments, each channel filter 106 comprises a multi-layered ScAIN structure 206 comprising one or more a single-crystal epitaxial ScAIN layers 216 (see FIG. 3) fabricated on the single crystal base 202. In some embodiments, the ScAIN layers 216 for each channel filter 106 may be based on desired frequency characteristics (e.g., a center frequency and bandwidth) of an associated one of the RF channels, although the scope of the embodiments is not limited in this respect.

In some embodiments, the monolithic platform 202 may comprise a single crystal base and at least some of the switching elements 104 may comprise either a scandium aluminum nitride (ScAIN) high-electron-mobility transistor (HEMT) structure 204 fabricated on the single crystal base 202, although the scope of the embodiments is not limited in this respect. In some embodiments, the monolithic platform 202 may comprise a single crystal base and at least some of the switching elements 104 may comprise a gallium nitride (GaN) high-electron-mobility transistor (HEMT) structure 204 fabricated on the single crystal base 202, although the scope of the embodiments is not limited in this respect.

In some embodiments, the elements of transistor structure 204, may comprise a heterogenous mix of Group III-Nitride devices. In these embodiments, Group III-Nitride devices may include, for example, ScAIN, GaN, InGaN, AlGaN, as well as other group III-Nitride devices. In some embodiments, the transistors may include HEMTs, MOSFETs, MISFETs, as well as others transistor structures.

In these embodiments, the number of layers as well as the concentration of Scandium (Sc) in a particular layer may determine the frequency characteristics for each channel filter 106. In some embodiments, a single ScAIN layer may be used to set the highest frequency. Additional etch stop layers allow for thicker ScAIN membrane films for lower resonant frequencies.

Figure 3:
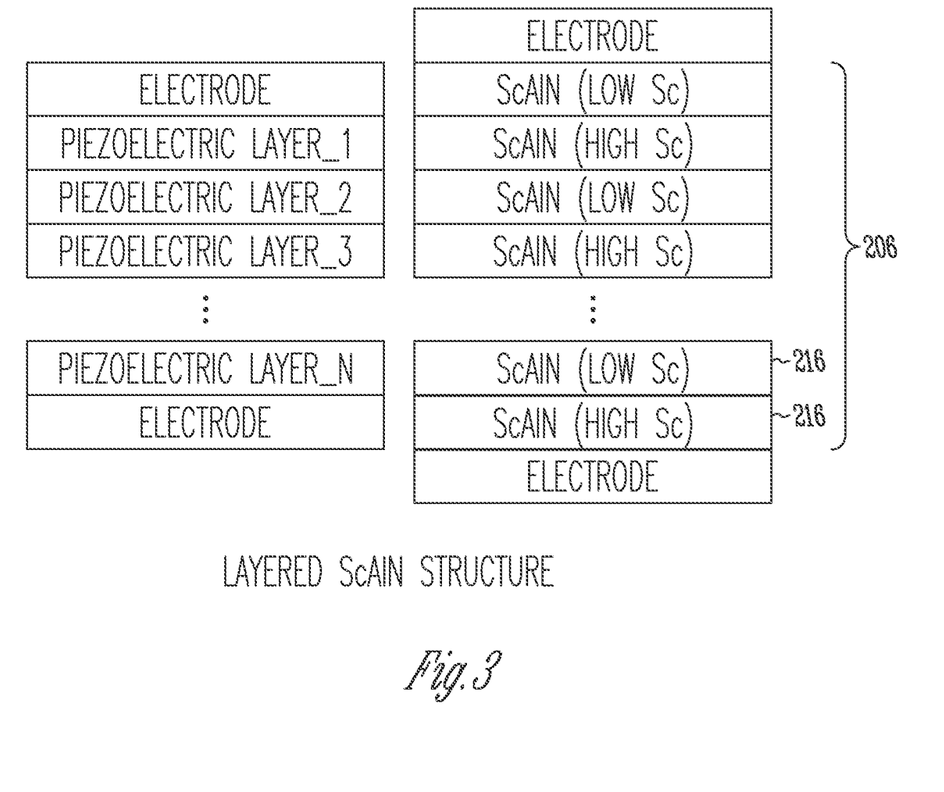
FIG. 3 illustrates a layered ScAIN structure in accordance with some embodiments.

FIG. 3 illustrates a layered ScAlN structure in accordance with some embodiments. In some embodiments, each ScAlN layer 216 comprises a scandium doped aluminum nitride thin film. In some embodiments, the single crystal base 202 may comprise silicon-carbon (SiC), silicon (Si), Gallium Nitride (GaN) or Aluminum Nitride (AlN). In some embodiments, the single crystal base 202 may comprise a heterogenous mix of Group III-Nitride materials.

In some embodiments, the ScAlN layers 216 may comprise a varied concentration of Scandium (Sc). In some embodiments, the ScAlN layers 216 comprise alternating ScAlN layers with higher and lower concentrations of Sc as illustrated in FIG. 3. In some embodiments, the lower concentrations may range from 0-25% Sc and the higher concentrations can range from 25-50% Sc, although the scope of the embodiments is not limited in this respect. In some embodiments, higher % Sc concentration layers may be used as etch stops since its selectivity with increasing % Sc composition increases significantly. In some embodiments, the lower concentrations of Sc range from 0-25% and the higher concentrations of Sc range from 25-50%.

In some embodiments, after growth of all layers of the multi-layered ScAlN structure 206, some of the ScAlN layers 216 may be selectively etched during fabrication based on the desired frequency characteristics for an associated channel. In these embodiments, lower Sc concentration materials may be selectively etched to control piezo thickness and allowing for frequency and coupling tuning across wafer. In some embodiments, Sc concentrations of greater than 27% may provide ferro-electric properties (i.e., a ferro-electric effect) and may be selected based on the desired frequency characteristics.

In some embodiments, the layers of the multi-layered ScAlN structure 206 may comprise epitaxial regrowth. In these embodiments, original growth for the HEMT structure may be patterned with $Si_3N_4$ to open a window for ScAlN regrowth, although the scope of the embodiments is not limited in this respect. This allows for integration of high bandwidth filters and high figure-of-merit (FOM) switches on the same monolithic platform 202, although the scope of the embodiments is not limited in this respect.

In some embodiments, the layers of the multi-layered ScAlN structure 206 may be part of a bulk-acoustic wave (BAW) resonator. In these embodiments, each ScAlN layer 216 may comprise a piezoelectric thin film. In some embodiments, the layers of the multi-layered ScAlN structure 206 may operate as other acoustic devices types including, for example, surface-acoustic-wave (SAW) resonators, Lamb wave resonators, and contour mode resonators, although the scope of the embodiments is not limited in this respect.

In some embodiments, the desired frequency characteristics of each channel filter may be individually tunable with a DC bias. In these embodiments, a DC bias may be applied to the channel filter 104 for a selected RF channel. An additional DC bias may be applied to change the desired frequency characteristics (e.g., bandwidth and/or center frequency) of the channel filter 106.

In some embodiments, the monolithic platform 202 may comprise one or more amplifiers instead of or in addition to the switching elements 104. In some embodiments, the one or more amplifiers may comprise a low-noise amplifier (LNA) provided in the RF signal path either prior to or after a channel filter 106, although the scope of the embodiments is not limited in this respect.

In some embodiments, one or more of the channel filters 106 may include one or more monolithically integrated ScAlN and Group III-Nitride based varactors configured for tuning the desired frequency characteristics of the channel filters 106.

Some embodiments are directed to single-chip structure, comprising an active element 104 and a filter 106. The active element 104 and filter 106 are integrated on the monolithic platform 202 and the monolithic platform 202 comprises a single crystal base. In these embodiments, the active element 104 may comprise either a scandium aluminum nitride (ScAlN), gallium nitride (GaN) or other Group III-Nitride transistors such as HEMT structure 204 fabricated on the single crystal base 202. The filter 106 may comprise a multi-layered ScAlN structure 206 comprising single-crystal epitaxial ScAlN layers 216 (FIG. 3) fabricated on the single crystal base 202. The number of the ScAlN layers 216 may be based on desired frequency characteristics (e.g., a center frequency and bandwidth) of the filter 106. In some embodiments, the active element comprises a low-noise amplifier (LNA). In some other embodiments, the active element comprises a switching element.

Figure 4A:
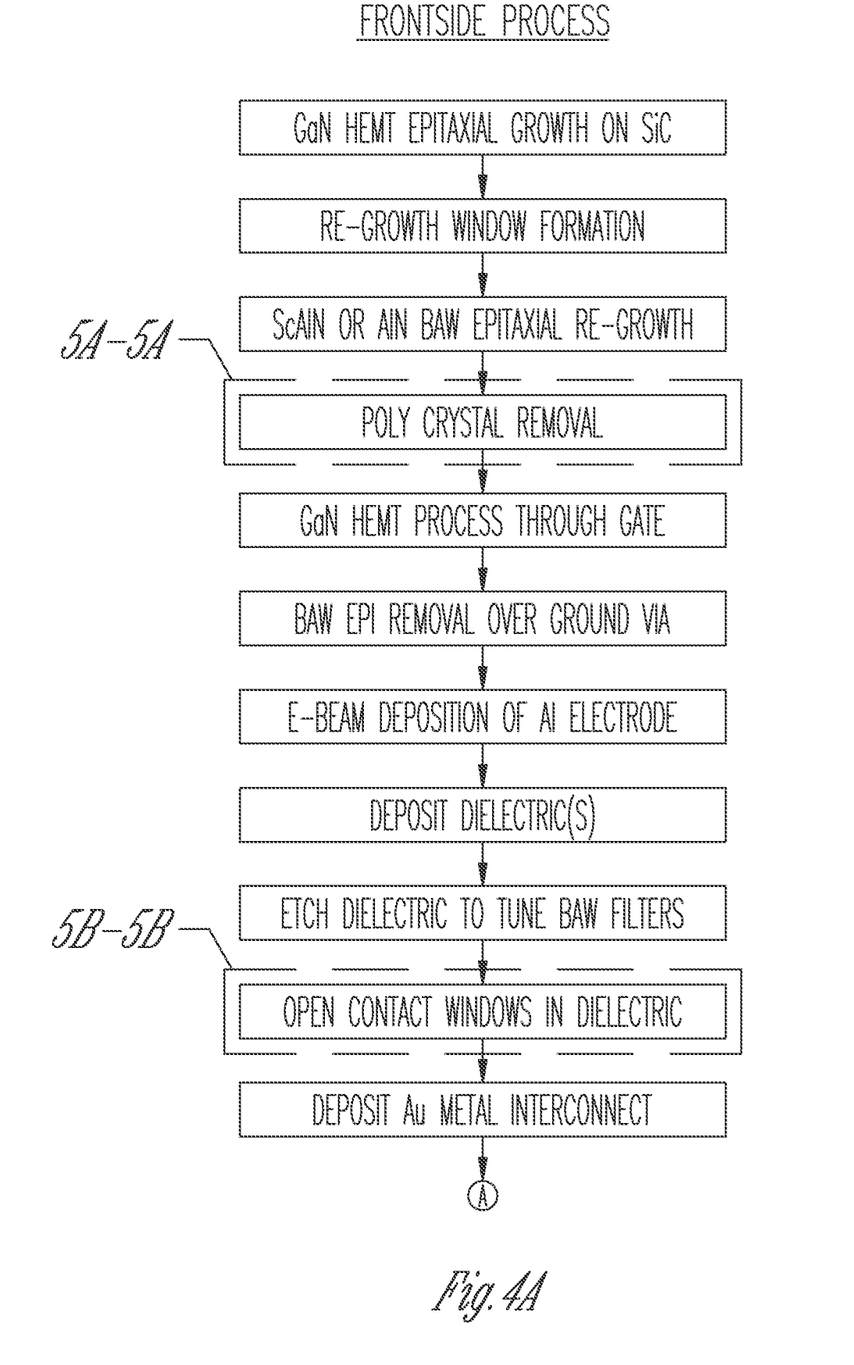
FIG. 4A-4B illustrates an example fabrication flow in accordance with some embodiments.
Figure 4B:
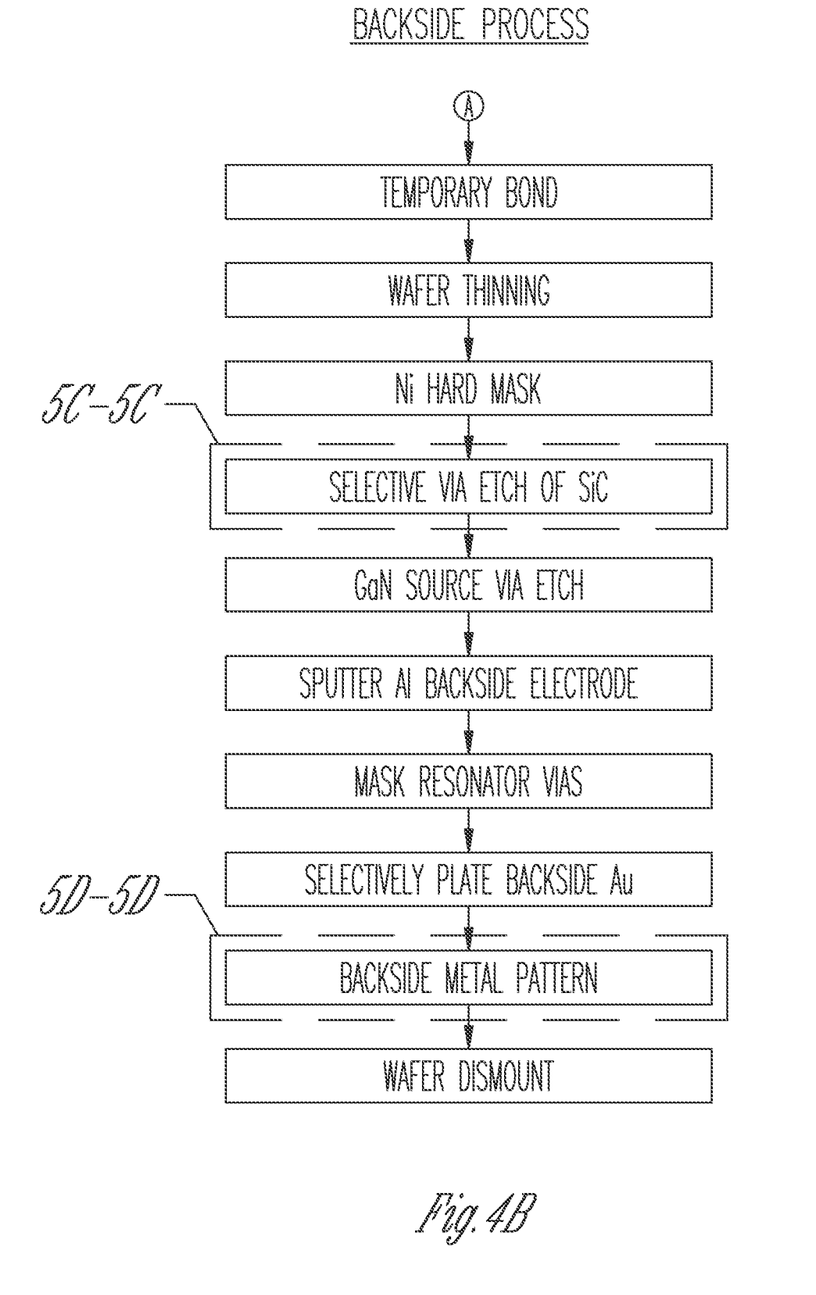

FIG. 4 illustrates an example fabrication flow in accordance with some embodiments. The fabrication flow includes epitaxial regrowth. In these embodiments, the original growth for the HEMT structure may be patterned with $Si_3N_4$ to open window for ScAlN regrowth. This allows for integration of high bandwidth filters and high FOM switches on same device. The fabrication flow also includes a selective etch for varied ScAlN layers. In these embodiments, layers with varied concentration of rare earth materials (e.g., Sc) may be used. This allows for frequency and coupling tuning across wafer and takes advantage of etching selectivity of higher-Sc concentration materials to control piezo thickness.

Figure 5A:
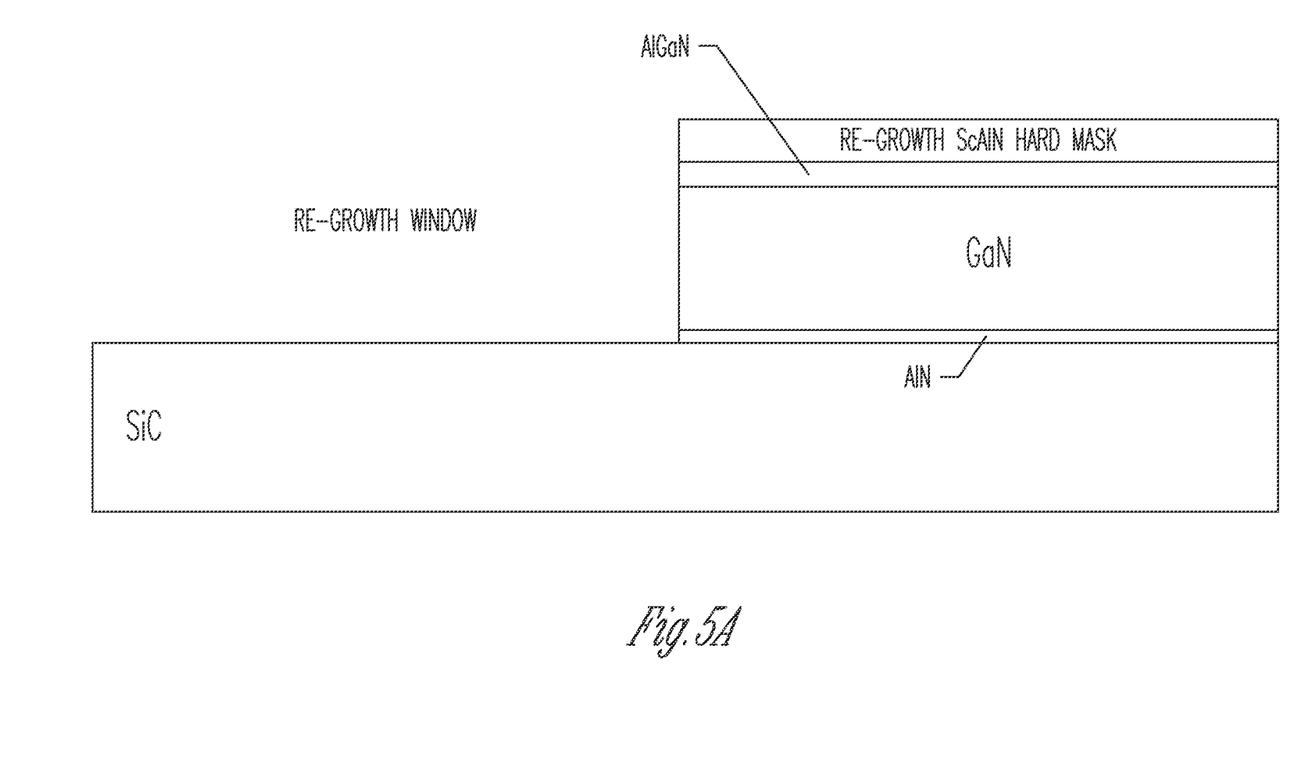
FIGS. 5A through 5D illustrate various steps in the fabrication flow of FIG. 4 in accordance with some embodiments.
Figure 5B:
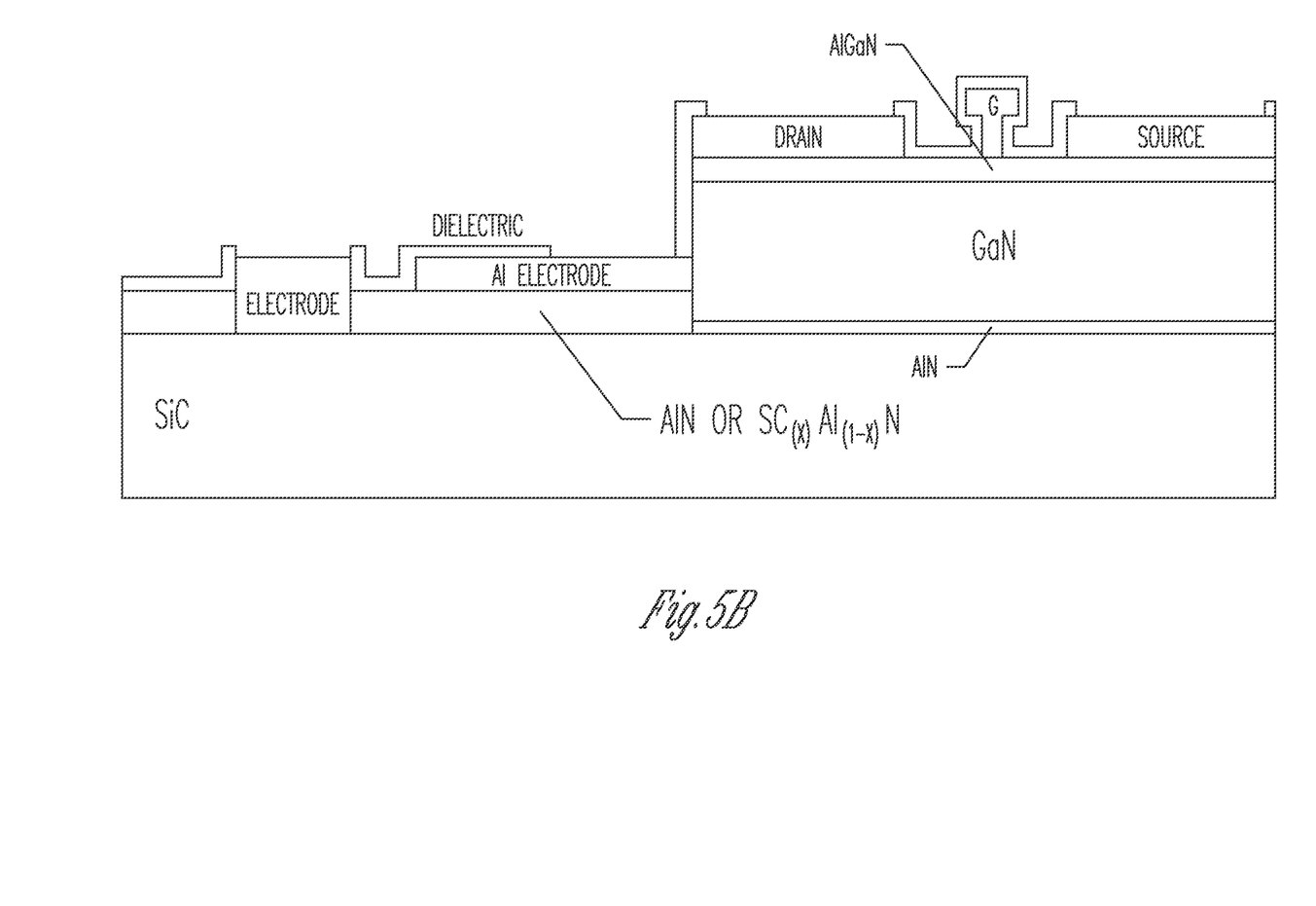
Figure 5C:
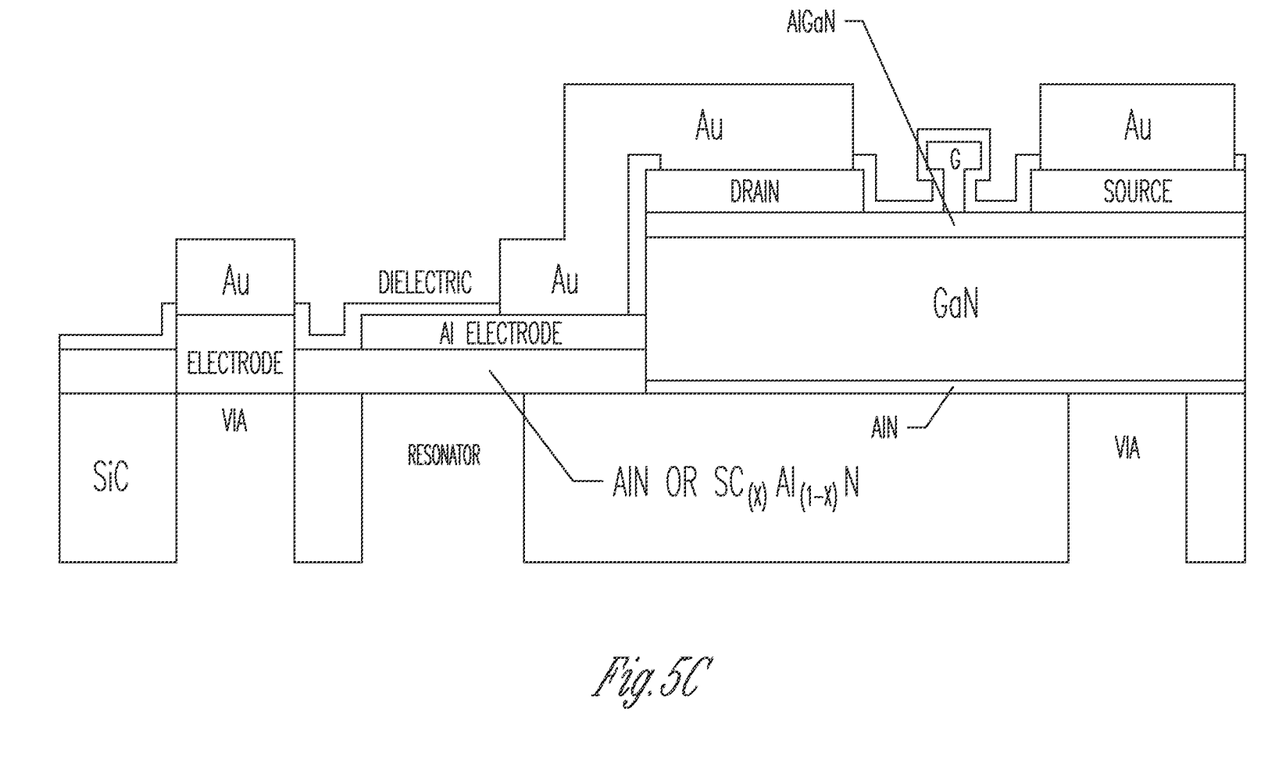
Figure 5D:
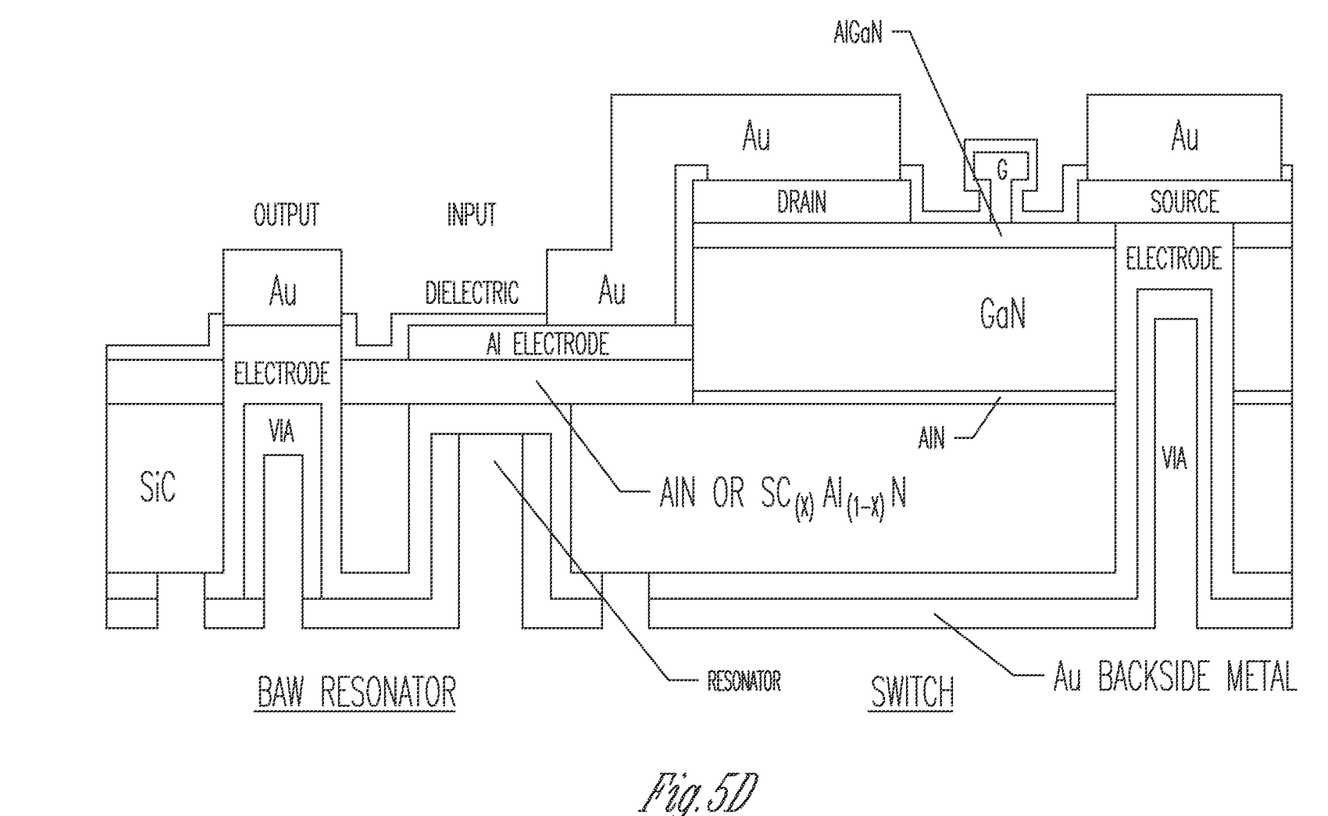

FIGS. 5A through 5D illustrate various steps in the fabrication flow of FIG. 4 in accordance with some embodiments. FIG. 5A illustrates the re-growth window. FIG. 5B illustrates open contact windows in the dielectric. FIG. 5C illustrates the selective etch of SiC. FIG. 5D illustrate backside metal patterning.

Figure 6:
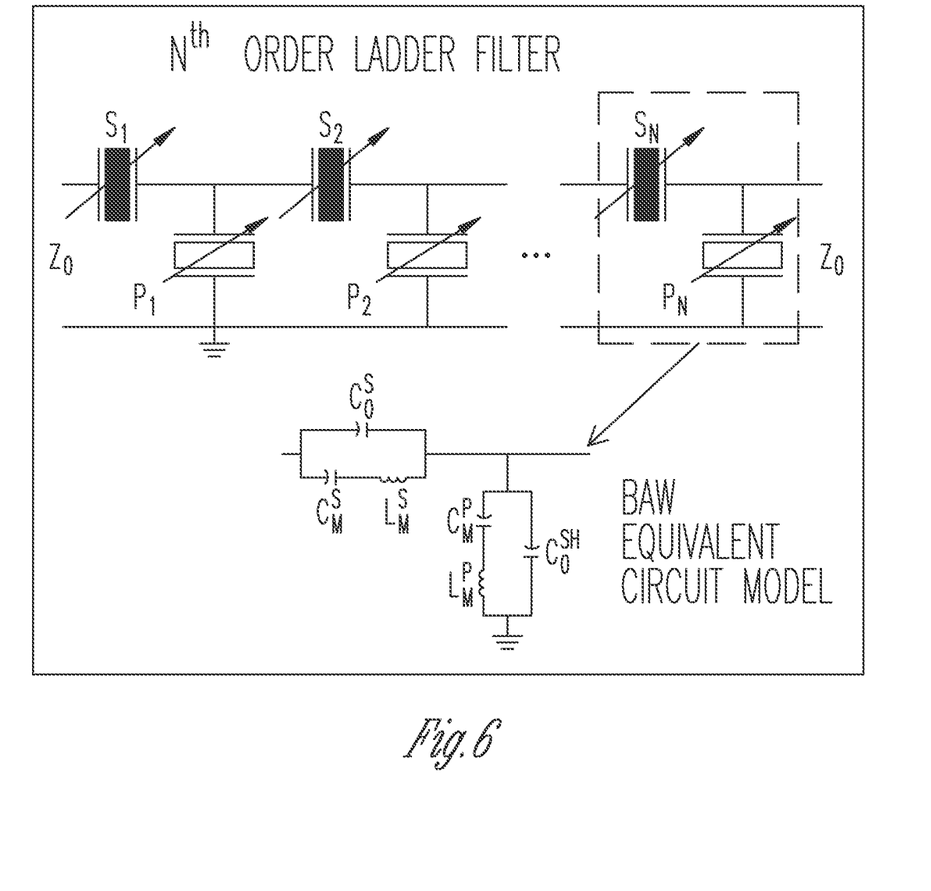
FIG. 6 illustrates a function circuit diagram of a filter in accordance with some embodiments.

FIG. 6 illustrates a function circuit diagram of a filter in accordance with some embodiments. The function circuit diagram shown in FIG. 6 may be represent a channel filter 106 (FIG. 1).

Figure 7:
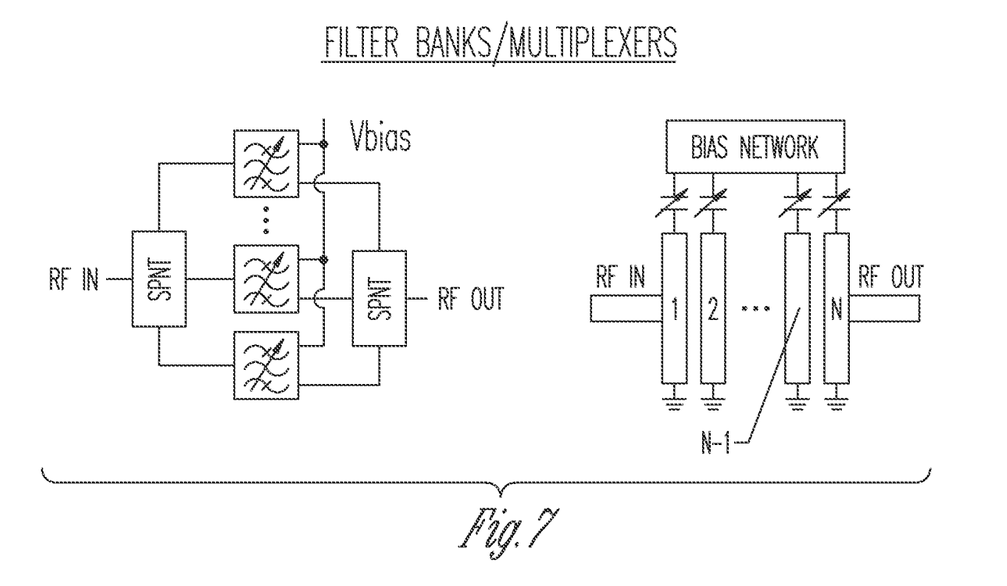
FIG. 7 illustrates function circuit diagrams of filter banks/multiplexers in accordance with some embodiments.

FIG. 7 illustrates function circuit diagrams of filter banks and multiplexers in accordance with some embodiments. The filter banks and multiplexers may be integrated on a monolithic platform, such as platform 202 (FIG. 2).

Figure 8:
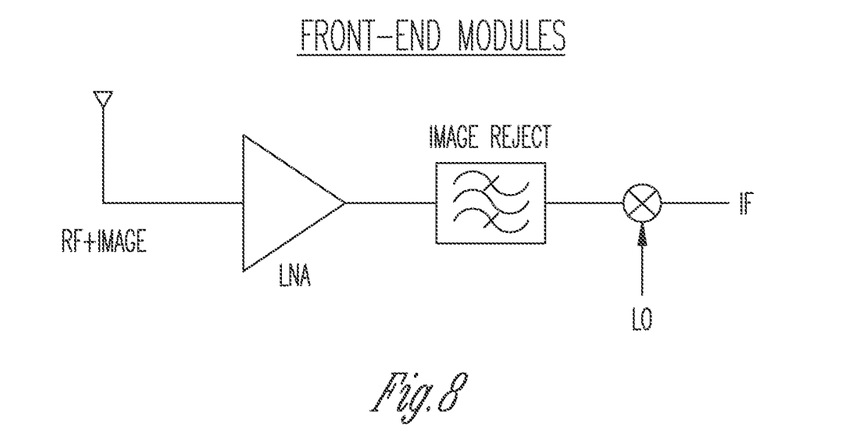
FIG. 8 illustrates a function diagram of a front-end module in accordance with some embodiments.

FIG. 8 illustrates a function diagram of a front-end module in accordance with some embodiments. The elements illustrated in FIG. 8 may be integrated on a monolithic platform, such as platform 202 (FIG. 2). In these embodiments, ultra-small, ultra-high-quality factor (Q) BAW filters may be integrated with amplifiers and mixers on a single chip GaN or ScAlN platform that may be tunable and may result in a reduced number of devices with a single local oscillator (LO) input.

In some embodiments illustrated in FIG. 8, an RF front-end comprises a low-noise amplifier (LNA) configured to receive RF signals, an image reject mixer configured to reject an image signal from the received RF signals, and a mixer configured to mix an output signal from the image reject mixer with an LO signal to generate an IF signal. The LNA and the image reject mixer may comprise a single-chip structure integrated on a monolithic platform. The monolithic platform may comprise a single crystal base. The LNA may comprise either a scandium aluminum nitride (ScAlN), gallium nitride (GaN) or other Group III-Nitride based transistor structure fabricated on the single crystal base. The image reject filter may comprise a multi-layered ScAlN structure comprising single-crystal epitaxial ScAlN layers fabricated on the single crystal base. The number of the ScAlN layers and Sc concentration per layer may be based on desired frequency characteristics of the image reject filter.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A single-chip ScAlN tunable filter bank comprising:
   a plurality of switching elements; and
   a plurality of channel filters, the switching elements and channel filters integrated on a monolithic platform, the tunable filter bank configured for selectively filtering multiple RF channels,
   wherein each channel filter associated with one of the multiple RF channels and configured to provide in an RF signal path between a pair of the switching elements,
   wherein the monolithic platform comprises a single crystal base,
   wherein each of the switching elements comprises at least one of a scandium aluminum nitride (ScAlN) or other Group III-Nitride transistor structure fabricated on the single crystal base,
   wherein each channel filter comprises a multi-layered ScAlN structure comprising one or more a single-crystal epitaxial ScAlN layers fabricated on the single crystal base, and
   wherein a number of the ScAlN layers is based on desired frequency characteristics of an associated one of the channel filters.

2. The single-chip ScAlN tunable filter bank of claim 1 wherein each ScAlN layer comprises a scandium doped aluminum nitride thin film, and
   wherein the single crystal base comprises one of silicon-carbon (SiC), silicon (Si), Gallium Nitride (GaN) and Aluminum Nitride (AlN).

3. The single-chip ScAlN tunable filter bank of claim 2 wherein the ScAlN layers comprise a varied concentration of Scandium (Sc),
   wherein a number of layers and concentration of Sc per layer are selected based on the desired frequency characteristics.

4. The single-chip ScAlN tunable filter bank of claim 3 wherein the ScAlN layers comprise alternating ScAlN layers with high and low concentrations of Sc.

5. The single-chip ScAlN tunable filter bank of claim 4, wherein the low concentrations of Sc range from 0-25% and the high concentrations of Sc range from 25-50%.

6. The single-chip ScAlN tunable filter bank of claim 5, wherein after growth of all layers of the multi-layered ScAlN structure, some of the ScAlN layers are selectively etched during fabrication based on the desired frequency characteristics for an associated channel.

7. The single-chip ScAlN tunable filter bank of claim 6, wherein the layers of the multi-layered ScAlN structure comprise epitaxial regrowth.

8. The single-chip ScAlN tunable filter bank of claim 7, wherein the layers of the multi-layered ScAlN structure are part of a bulk-acoustic wave (BAW) resonator, each ScAlN layer comprising a piezoelectric thin film, wherein the desired frequency characteristics each channel filter is individually tunable with a DC bias using either a ferroelectric effect of the piezoelectric thin film.

9. The single-chip ScAlN tunable filter bank of claim 8, wherein one or more of the channel filters comprise one or more monolithically integrated ScAlN or Group III-Nitride based varactors configured for tuning the desired frequency characteristics of the channel filters.

10. The single-chip ScAlN tunable filter bank of claim 9 wherein the monolithic platform comprises a single monolithic platform, and
    wherein the switching elements and channel filters are integrated on the single monolithic platform.

11. A single-chip structure, comprising:
    an active element; and
    a filter, the active element and filter integrated on a monolithic platform,
    wherein the monolithic platform comprises a single crystal base,
    wherein the active element comprises at least one of a scandium aluminum nitride (ScAlN) or other Group III-Nitride transistor structure fabricated on the single crystal base,
    wherein the filter comprises a multi-layered ScAlN structure comprising single-crystal epitaxial ScAlN layers fabricated on the single crystal base, and
    wherein a number of the ScAlN layers is based on desired frequency characteristics of the filter.

12. The single-chip structure of claim 11, wherein the active element comprises a low-noise amplifier (LNA).

13. The single-chip structure of claim 11, wherein the active element comprises a switching element.

14. The single-chip structure of claim 11 wherein each ScAlN layer comprises a scandium doped aluminum nitride thin film; and
    wherein the single crystal base comprises one of silicon-carbon (SiC), silicon (Si), Gallium Nitride (GaN) and Aluminum Nitride (AlN).

15. The single-chip structure of claim 14 wherein the ScAlN layers comprise alternating ScAlN layers with high and low concentrations of Sc.

16. The single-chip structure of claim 15 wherein after growth of all layers of the multi-layered ScAlN structure, some of the ScAlN layers are selectively etched during fabrication based on desired frequency characteristics of the filter.

17. The single-chip structure of claim 16, wherein the layers of the multi-layered ScAlN structure comprise epitaxial regrowth.

18. The single-chip structure of claim 17 wherein the filter is one of a plurality of filters integrated on the monolithic platform, and
    wherein a number of ScAlN layers of each filter is based on desired frequency characteristics of an associated filter.

19. An apparatus of an RF front-end, the apparatus comprising:
    a low-noise amplifier (LNA) configured to receive RF signals from multiple channels;
    an image reject mixer configured to reject an image signal from the received RF signals; and
    a mixer configured to mix an output signal from the image reject mixer with an LO signal to generate an IF signal,
    wherein the LNA and the image reject mixer comprise a single-chip structure integrated on a monolithic platform, wherein the monolithic platform comprises a single crystal base, wherein the LNA comprises at least one of a scandium aluminum nitride (ScAlN) or other Group III-Nitride transistor structure fabricated on the single crystal base, wherein the image reject filter comprises a multi-layered ScAlN structure comprising single-crystal epitaxial ScAlN layers fabricated on the single crystal base, and wherein a number of the ScAlN layers is based on desired frequency characteristics of the image reject filter.

20. The apparatus of claim 19, wherein each ScAlN layer comprises a scandium doped aluminum nitride thin film, wherein the single crystal base comprises one of silicon-carbon (SiC), silicon (Si), Gallium Nitride (GaN) and Aluminum Nitride (AlN), wherein the ScAlN layers comprise a varied concentration of Scandium (Sc), and wherein the number of layers and concentration of Sc per layer are selected based on the desired frequency characteristics.

* * * * *

UNITED STATES PATENT AND TRADEMARK OFFICE
CERTIFICATE OF CORRECTION

PATENT NO. : 11,848,662 B2
APPLICATION NO. : 17/018897
DATED : December 19, 2023
INVENTOR(S) : Soric et al.

It is certified that error appears in the above-identified patent and that said Letters Patent is hereby corrected as shown below:

In the Specification

In Column 3, Line 55, delete "104" and insert --106-- therefor

Signed and Sealed this
Twelfth Day of November, 2024

Katherine Kelly Vidal
*Director of the United States Patent and Trademark Office*